(12) United States Patent
Kaseda et al.

(10) Patent No.: US 7,734,564 B2
(45) Date of Patent: Jun. 8, 2010

(54) METHOD OF DATA PROCESSING AND PROGRAM

(75) Inventors: Chosei Kaseda, Tokyo (JP); Kozo Takayama, Tokyo (JP)

(73) Assignee: Yamatake Corporation, Tokyo (JP)

( * ) Notice: Subject to any disclaimer, the term of this patent is extended or adjusted under 35 U.S.C. 154(b) by 863 days.

(21) Appl. No.: 11/340,553

(22) Filed: Jan. 27, 2006

(65) Prior Publication Data

US 2006/0241922 A1   Oct. 26, 2006

(30) Foreign Application Priority Data

Mar. 24, 2005   (JP)   ............... 2005-086871

(51) Int. Cl.
G06F 15/00 (2006.01)
G06F 15/18 (2006.01)

(52) U.S. Cl. ...................................... 706/62

(58) Field of Classification Search .............. None
See application file for complete search history.

(56) References Cited

U.S. PATENT DOCUMENTS

2005/0031197 A1* 2/2005 Knopp ................. 382/154

FOREIGN PATENT DOCUMENTS

| JP | 63-149668 | 6/1988 |
| JP | 1-267667 | 10/1989 |
| JP | 3-240076 | 10/1991 |
| JP | 4-358175 | 12/1992 |
| JP | 7-168417 | 7/1995 |
| JP | 2001-296723 | 10/2001 |
| JP | 2002-139893 | 5/2002 |
| JP | 2002-183111 | 6/2002 |
| JP | 2004-354477 | 12/2004 |
| JP | 2005-24830 | 1/2005 |
| JP | 2005-91818 | 4/2005 |

OTHER PUBLICATIONS

'Consideration of Physical Condition in estimation of Blood Glucose Level Via Data Mining': Yamaguchi, IEEE, 2004, 0-7803-8439-3, pp. 754-757.*
'Parameter optimization technique using the response surface methodology': Koyamada, IEEE 2004, 0-7803-8439-3, pp. 2909-2912.*
'Non parameter statistics on extreme rainfall': Nielsen, Nordic hydrology, 1994, 267-278.*
Chosei Kaseda, "The Practical Study on Response Surface Methodology", 7 pages, publication date Aug. 11, 2004.

* cited by examiner

*Primary Examiner*—David R Vincent
*Assistant Examiner*—Peter Coughlan
(74) *Attorney, Agent, or Firm*—Oblon, Spivak, McClelland, Maier & Neustadt, L.L.P.

(57) ABSTRACT

The method first creates a BS database by randomly sampling experimental data items from an experimental data DB storing a plurality of experimental data items having n (n is an integer of 2 or larger) kinds of variates. It then identificates an n-dimensional sampling curve or surface model approximating a correlation of the n kinds of variates with reference to the BS database, and stores the model into a BS optimum solution database. The method then repeats the creation of the BS database and the identification of the sampling curve or surface model, thereby creating the optimum solution database. Finally, the method obtains a mean and variance of the optimum solution with reference to the BS optimum solution database and estimates the reliability of the optimum solution from these values.

9 Claims, 13 Drawing Sheets

CONTRIBUTION IN SURFACE MODEL REGARDING CHARACTERISTIC VALUE $Y_1$

CONTRIBUTION IN SURFACE MODEL REGARDING CHARACTERISTIC VALUE $Y_2$

RELATED ART

METHOD OF DATA PROCESSING AND PROGRAM

BACKGROUND OF THE INVENTION

1. Field of the Invention

The present invention relates to data processing method and program suitable for use in Response Surface Methodology (RSM) which effectively utilizes less experimental data to enhance design efficiency. Particularly, the present invention relates to data processing method and program capable of estimating obtained curve or surface model and the like.

2. Description of Related Art

Recent heightening of user requirements, intensification of competition in the marketplace, and the introduction of cheap foreign products have all resulted in increased market demands in the areas of product quality, delivery, and costing. Furthermore, there are demands for both increased efficient in product and productivity planning, and for reduced development costs. In response to these demands, recent years have seen more interest in response surface methodology, a technology for efficient implementation of design tasks that require high amounts of experimentation.

Japanese Unexamined Patent Application Publication No. 2002-18311, which is referred to herein as the related art 1, for example, contains disclosure concerning a method that efficiently identifies a response surface model by biharmonic spline interpolation based on the Green function with the use of data collected according to the experimental design. The response surface model is used in Response Surface Methodology (RSM) for pharmaceutical design, materials design, design or adjustment of system operating conditions and product manufacturing conditions and the like.

The use of the response surface model generated by the biharmonic spline interpolation based on the Green function described in the related art 1 enables easy finding of optimum design conditions. It is thereby possible to find optimum design conditions quickly from a small amount of experimental data even for a complex and unknown design target.

Yutaka Tanaka et al. "Handbook of Statistical Analysis", 1995, pp. 22-24 describes that, where a correlation (responce) between design conditions and product characteristics is expressed by a linear polynominal (linear regression model), it is possible to estimate variations in a response surface model based on a statistical approximate error and thus possible to estimate the reliability of an optimum solution.

A conventional response surface model generation and estimation method where a response surface model is a linear regression model is described herein. FIG. 11 is a block diagram showing a conventioal response surface model estimation apparatus 100. The response surface model estimation apparatus 100 includes an experimental data DB 101 for storing experimental data, a response surface model generation section 102, an optimum solution search section 103, a response surface model estimation section 104, and an optimum solution estimation index calculation section 105. The response surface model generation section 102 generates a response surface model, which is a linear regression model, from the experimental data stored in the experimental data DB 101. The optimum solution search section 103 searches for an optimum solution of the generated surface model. The response surface model estimation section 104 calculates F value, which is described below, from the response surface model. The optimum solution estimation index calculation section 105 calculates an estimation index from the optimum solucion obtained by the optimum solution search section 103 and the F value calculated by the response surface model estimation section 104.

The conventional response surface model estimation apparatus 100 obtains an estimation index of the reliability of an optimum solution based on the approximation accuracy of a response surface model identificated from experimental data, which is goodness of fit of a regression model to data (F value in the following equation 1):

$$F = \frac{V_R}{V_e} \quad (1)$$

where, when $\bar{y}$ is the mean of n-number of data items of response variable y;

$\hat{y}$ is the estimate by a regression model; and p is the degree of freedom, parameter variation:

$$V_R = \frac{\sum_{i=1}^{n}(\hat{y}_i - \bar{y})^2}{p},$$

and model accuracy:

$$V_e = \frac{\sum_{i=1}^{n}(y_i - \hat{y}_i)^2}{(n-p-1)}.$$

However, the application of the estimation based on a statistical approximate error in the case where a response surface model is a linear regression model is limited to partucular targets. The estimation method cannot be applied to a target with a complex correlation (responce) between design conditions and product characteristics, like a non-linear response surface as described in the related art 1. This means that there is no solution estimation means for a technique described in the related art 1, though actual product design needs to make allowances for variations in optimum conditions (optimum solution).

SUMMARY OF THE INVENTION

The present invention has been accomplished to solve the above problems and an object of the present invention is thus to provide data processing method and program capable of estimating the reliability of an optimum solution obtained by a response surface model, thus achieving appropriate design in consideration of the risk due to variations and the safety factor of a product.

To these ends, according to one aspect of the present invention, there is provided a data processing method which includes creating a sampling database by randomly sampling from a plurality of collection data items having N (N is an integer of 2 or larger) kinds of variates and stored in a collection database, generating an N-dimensional curve or surface model approximating a correlation of the N kinds of variates as a sampling curve or surface model with reference to the sampling database, calculating an optimum solution of the sampling curve or surface model as a sampling optimum solution, creating a sampling optimum solution database storing a plurality of sampling optimum solutions by repeating the creation of the sampling database to the calculation of the sampling optimum solution, and obtaining a first estimation index with reference to the sampling optimum solution database.

The present invention obtains a plurality of sampling optimum solutions from collection data and creates a sampling optimum solution database. The use of the first estimation index which is obtained with reference to the sampling optimum solution database enables the estimation of the reliability of a sampling optimum solution, the estimation of the reliability of an original curve or surface model obtained from the collection data, the estimation of the quantity and quality of the collection database, and so on.

In the above data processing method, the first estimation index may be a mean and a variance of the sampling optimum solution. For example, it is feasible to regard the degree of the variance as the degree of reliability and estimate the reliability of the optimum solution based on these values.

The above data processing method may generate an N-dimensional original curve or surface model approximating a correlation of the N kinds of variates with reference to the collection database, calculate an optimum solution of the original curve or surface model, and estimate a reliability of the optimum solution of the original curve or surface model based on a comparison result between the optimum solution of the original curve or surface model and the first estimation index. Further, the method may evaluate the collection database based on a result of estimating the reliability of the optimum solution of the original curve or surface model.

The above data processing method may further collect a new collection data item based on a result of estimating the reliability of the optimum solution of the original curve or surface model. This enables efficient collection of data.

In this case, the new collection data item may be collected when a divergence between the optimum solution of the original curve or surface model and the first estimation index is equal to or larger than a prescribed threshold. This allows the determination criterion for collecting data to vary according to the type of collection data, the complexity of a model and so on, thereby enabling efficient collection of data.

Further, it is preferred to obtain a mean of the sampling optimum solution as the first estimation index, so that data in near proximity to the sampling optimum solution is collected as the new collection data item. This enables more efficient collection of data.

In the above data processing method, the N-dimensional sampling curve or surface model may be generated by spline interpolation. Since the curve or surface model depends only on variations in collection data, it is possible to estimate the curve or surface model highly accurately.

The above data processing method may create a variate estimation collection database storing variate estimation collection data items excluding an estimation variate which is one or more variate selected from the N kinds of variates of the collection data items stored in the collection database, create a variate estimation sampling database by randomly sampling from the variate estimation collection data items with reference to the variate estimation collection database, generate an N-dimensional variate estimation curve or surface model approximating a correlation of the N kinds of variates with reference to the variate estimation sampling database, calculate an optimum solution of the variate estimation curve or surface model as a variate estimation optimum solution, create a variate estimation optimum solution database storing a plurality of variate estimation optimum solutions by repeating the creation of the variate estimation sampling database to the calculation of the variate estimation optimum solution, obtain a second estimation index with reference to the variate estimation optimum solution database, and estimates the estimation variable based on a comparison result between the first estimation index and the second estimation index.

The calculation of the second estimation index enables the estimation of the contribution or significance to the optimum solution of the curve or surface model for each variate or a plurality of variates. It is thereby possible to obtain the estimation of each variate or a plurality of variates and use it for the review of the collection data, the generation of the curve or surface model, the recollection of collection data and so on.

According to another aspect of the present invention, there is provided a computer program product which causes a computer to implement the above-described data processing.

The data processing method and program according to the present invention enables the generatoin of a response surface model or the like of a design target from a small amount of experimental data and the appropriate estimation of the generated model.

The above and other objects, features and advantages of the present invention will become more fully understood from the detailed description given hereinbelow and the accompanying drawings which are given by way of illustration only, and thus are not to be considered as limiting the present invention.

DESCRIPTION OF THE PREFERRED EMBODIMENTS

Figure 1:
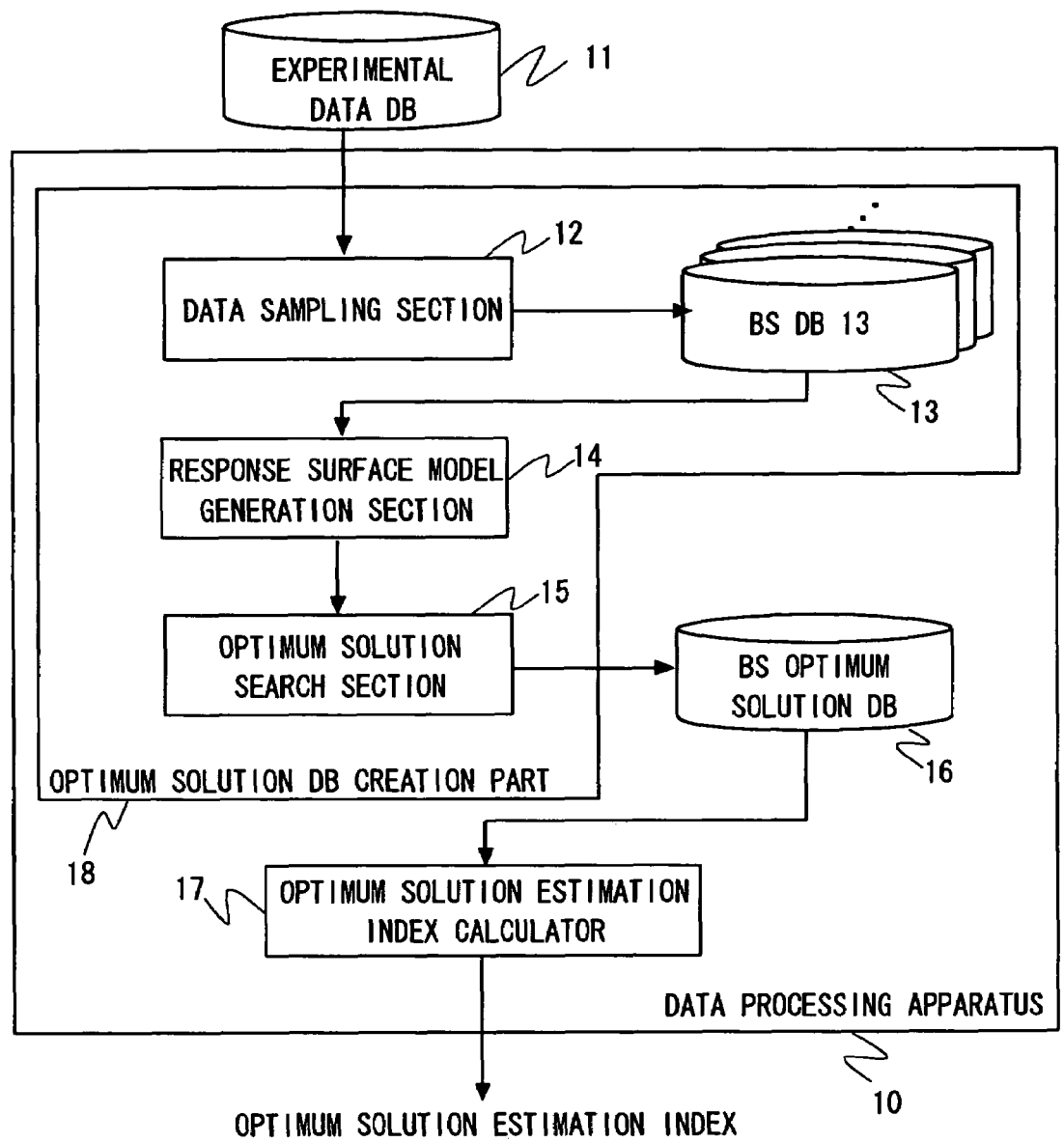
FIG. 1 is a block diagram showing a data processing apparatus according to a first embodiment of the invention.

Preferred embodiments of the present invention are described hereinafter in detail with reference to the drawings.

In the following embodiments, the present invention is applied to the reliability estimation method using the bootstrap. The method generates a response surface model of a design target from a small amount of experimental data, easily finds optimum design conditions with the use of the generated response surface model, and estimates the reliability of the optimum solution.

For better understanding of the present invention, the advantages to use the bootstrap and multivariate spline are described firstly. The bootstrap is a statistical technique for estimating the characteristics of population from a limited amount of samples. For example, in order to obtain a population mean $\theta$ of a given random variable y, the mean of a sample Y from the population, which is sample mean $\hat{\theta}$, may be calculated.

If the number of samples Y is statistically sufficiently large, the sample mean $\hat{\theta}$ comes closer to a population mean, which is a true mean, by the central limit theorem. Further, the sample mean $\hat{\theta}$ serving as a random variable, which is a functional parameter of random variable $Y_i$ in a broad sense, comes closer to the normal distribution, thus allowing the estimation of its variations (variance). On the other hand, if the number of samples is not statistically sufficient, the bootstrap may be used. The use of the bootstrap enables to resample a large number of samples from the original samples to examine the characteristics of a true population that is a population mean, for example.

The following description is given on the case of randomly sampling from the n-number of limited samples $Y_i$ ($Y_1$ to $Y_n$) and generating another sample (bootstrap sample). The sampling is not necessarily random as long as it is suited to examine the characteristics of a true population. In the generation of the bootstrap sample, the sampling that allows repeated selection of the same one is performed by using random numbers, thereby implementing random duplicate sampling. By generating a plurality of (e.g. m-number of) bootstrap samples, the mean of the m-number of bootstrap samples (bootstrap estimate in a broad sense) comes closer to the normal distribution according to the central limit theorem, thus allowing the estimation of the population mean and variance (reliability) based on a large number of bootstrap samples.

The use of the bootstrap requires the following prerequisites:
(1) the random variable $Y_i$ being according to the distribution function F, and
(2) the functional parameter $\hat{\theta}$ (sample mean; optimum solution in the embodiments described later) depending only on the distribution function F, expressed as $\theta=\theta(F)$. Therefore, the bootstrap cannot be applied to the estimation of parameter $\theta=\theta(F, P)$ which depends on the distribution F of $Y_i$ and another distribution P, for example, as described in Wang, Jinfang et al. "Calculation Statistics I", Iwanami Shoten, Publishers, 2003, pp. 5-6.

Hence, in the application of the bootstrap to the reliability estimation of optimum solution search results from a small amount of experimental data, it is necessary that the characteristics of a bootstrap optimum solution set depend on no other distribution factors than variations (distribution function F) in experimental data. For example, the optimum solution (also referred as the response surface) calculated from a given combination of experimental data (bootstrap sample) should be identical if the combination of data is identical.

In the method of identifying an optimum solution with the use of a response surface model as described in the related 1 such as the polynomial model or a neural network, for example, the model tuning, the operation to determine an order or a learning parameter by trial and error, is not determinate. The model tuning thereby becomes the kind of variation factor. This generates a distribution function which is different from experimental data as a sample, resulting in different optimum solutions (response surfaces) to be obtained from the same combination of experimental data. Thus, the reliability cannot be estimated appropriately even with the use of the bootstrap.

On the other hand, the embodiments of the present invention identificate a response surface model by using a multivariate spline such as a thin plate spline. In this case, a variation in the optimum solution (the response surface) does not occur in the model tuning itself, and the characteristics depend only on variations in experimental data. It is therefore possible to uniquely determine an optimum solution (functional parameter) obtained from a database (sample). The above-mentioned prerequisites are thereby satisfied. The use of the multivariate spline for a response surface model as described in this embodiment enables to accurately estimate the reliability of an optimum solution based on the bootstrap (BS). A method of estimating the reliability of an optimum solution based on the above-described bootstrap is described in detail hereinbelow.

First Embodiment

A first embodiment of the present invention is described hereinbelow. FIG. 1 is a block diagram showing a data processing apparatus according to the first embodiment of the invention. As shown in FIG. 1, the data processing apparatus 10 includes a data sampling section 12, a BS database 13 to serve as a sampling database, a BS response surface model generation section 14, an optimum solution search section 15, a BS optimum solution database 16, and an optimum solution estimation index calculator 17.

The data sampling section 12 randomly samples experimental data from an experimental data database (DB) 11. The data sampling section 12 creates the BS database 13 by random sampling. The BS response surface model generation section 14 generates a BS response surface model from the BS database 13. The optimum solution search section 15 searches for an optimum solution of the response surface model generated by the BS response surface model generation section 14 and stores the obtained optimum solution into the BS optimum solution database 16. The optimum solution estimation index calculator 17 calculates an optimum solution estimation index as a first estimation index in reference to the BS optimum solution database 16. The data sampling section 12, the BS database 13, the response surface model generation section 14, and the optimum solution search section 15 constitute an optimum solution database creation part 18. The data processing apparatus 10 is described in further detail below.

The experimental data to be stored in the experimental data DB 11 may be a set of the estimation results of product characteristics when a plurality of design factors (design conditions) vary, for example. In the mixing rate design of drug in tablet form, for instance, the design factors (design conditions) may involve the amount of each composition and the process conditions such as tableting pressure. The product characteristics may involve fast-release (characteristics to enhance the release of medicinal properties) and slow-release (characteristics to suppress the release of medicinal properties).

For example, the data base which contains experimental data $d_j$ ($1 \leq j \leq n$) composed of 1 to p number of factors X (factor $X_{(1)}$, $X_{(2)}$ to $X_{(p)}$) and 1 to q number of characteristic values Y (characteristic value $Y_{(1)}$, $Y_{(2)}$ to $Y_{(q)}$) may be expressed as the following equation 2. Though the database expressed by the equation 2 is used as the experimental data DB 11 in this embodiment, it is not limited thereto as long as the experimental data $d_j$ has N (N is an integer of 2 or above) or larger number of variates composed of the factors X and the characteristic values Y. The experimental data is not limited to the data obtained by actual experiments but may be the data such as experimental design data which is collected by orthogonal array, spherical experimental design and so on, for example. Further, the experimental data may be collected data as non-experimental design data such as when data of the experiments which are additionally performed several times is added to the experimental design data which has been collected in the past or when lack of data happens in the data intended to be collected in experimental design arrangement.

$$DB = \begin{cases} d_1 = \lfloor X_{(1)1}, X_{(2)1}, \cdots, X_{(p)1}, Y_{(1)1}, Y_{(2)1}, \cdots, Y_{(q)1} \rfloor \\ d_2 = [X_{(1)2}, X_{(2)2}, \cdots, X_{(p)2}, Y_{(1)2}, Y_{(2)2}, \cdots, Y_{(q)2}] \\ \vdots \\ d_j = [X_{(1)j}, X_{(2)j}, \cdots, X_{(p)j}, Y_{(1)j}, Y_{(2)j}, \cdots, Y_{(q)j}] \\ \vdots \\ d_n = [X_{(1)n}, X_{(2)n}, \cdots, X_{(p)n}, Y_{(1)n}, Y_{(2)n}, \cdots, Y_{(q)n}] \end{cases}$$ (2)

$$\equiv [d_1, d_2, \cdots, d_j, \cdots, d_n]^T$$

Figure 2:
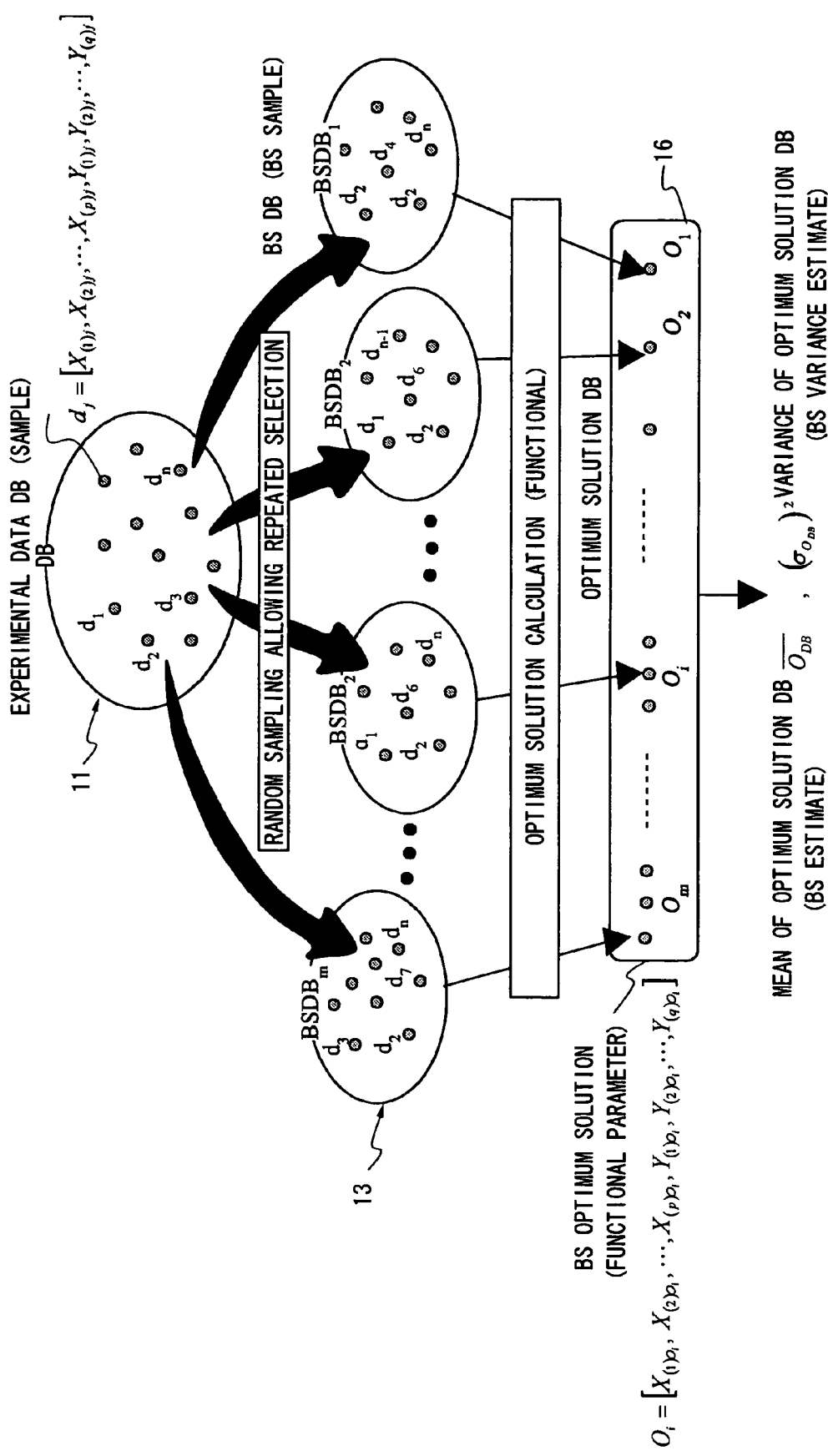
FIG. 2 is a block diagram to describe an optimum solution database generation method with the use of the bootstrap according to the first embodiment of the invention.

FIG. 2 is a block diagram to describe a method of creating an optimum solution database with the use of the above-described bootstrap according to this embodiment. As shown in FIG. 2, the database (experimental data DB 11) which contains the n-number of experimental data $d_j$ ($d_1$ to $d_n$) as expressed by the above equation 2 is used as a sample.

The data sampling section 12 creates a sampling DB according to the bootstrap (see Wang, Jinfang et al. "Calculation Statistics I", Iwanami Shoten, Publishers, 2003). Specifically, it implements random sampling that allows repeated selection from the experimental data DB 11 with the use of random numbers or the like and thereby creates a database (BS database) 13 which also contains the n-number of experimental data, which serves as a bootstrap sample. The sampling to create the BS database is not limited to the random sampling with the use of random numbers or the like. Any sampling technique may be used as long as it is arbitrary sampling which eventually selects experimental data at random.

The experimental data DB 11 contains the 1 to n number of experimental data $d_j$. By randomly sampling the experimental data $d_j$ with the use of random numbers which are generated by a random number generator, for example, a database (BS database 13) which serves as one sampling DB is created.

The process from the creation of the BS database by the data sampling section 12 to the search of an optimum solution by the optimum solution search section 15, which is described later, is repeated a number of times as needed. For example, the BS database 13 (BSDB$_i$) which is created in the i-th (i=1 to m) round of process may be expressed as the following equation 3:

$$DB_i = \begin{cases} d_2 = \lfloor X_{(1)2}, X_{(2)2}, \cdots, X_{(p)2}, Y_{(1)2}, Y_{(2)2}, \cdots, Y_{(q)2} \rfloor \\ d_6 = [X_{(1)6}, X_{(2)6}, \cdots, X_{(p)6}, Y_{(1)6}, Y_{(2)6}, \cdots, Y_{(q)6}] \\ d_2 = [X_{(1)2}, X_{(2)2}, \cdots, X_{(p)2}, Y_{(1)2}, Y_{(2)2}, \cdots, Y_{(q)2}] \\ d_1 = [X_{(1)1}, X_{(2)1}, \cdots, X_{(p)1}, Y_{(1)1}, Y_{(2)1}, \cdots, Y_{(q)1}] \\ d_3 = [X_{(1)3}, X_{(2)3}, \cdots, X_{(p)3}, Y_{(1)3}, Y_{(2)3}, \cdots, Y_{(q)3}] \\ d_1 = [X_{(1)1}, X_{(2)1}, \cdots, X_{(p)1}, Y_{(1)1}, Y_{(2)1}, \cdots, Y_{(q)1}] \\ \vdots \end{cases}$$ (3)

$$\equiv [d_2, d_6, d_2, d_1, d_3, d_1, \cdots]^T$$

In this way, the BS database 13 is created by randomly sampling the experimental data $d_j$ from the experimental data DB (equation 2), allowing repeated selection. Though the number of data items to be sampled is the same as the number of experimental data $d_j$, which is n, in this embodiment, it is not limited thereto. Further, because of the random sampling, the created BS database is not necessarily identical to the equation 3 with ($d_2$, $d_6$, $d_2$, $d_1$, $d_3$, $d_1$ ... ) as illustrated in FIG. 2.

Then, an optimum solution, which is functional, is calculated for the BS database 13. In this embodiment, the BS response surface model generation section 14 generates a response surface model, and then the optimum solution search section 15 searches for an optimum solution of the model. The obtained BS optimum solution is stored in the BS optimum solution database 16. The above process of creating the BS database, generating the response surface model and searching for the optimum solution is repeated m times, for example.

In the i-th round of process, for example, the data sampling section 12 creates BSDB$_i$ to serve as the BS database 13, and the optimum solution search section 15 obtains a BS optimum solution O$_i$ from the BSDB$_i$ and stores it into the BS optimum solution database 16. The BS response surface model generation section 14 and the optimum solution search section 15 may implement the process of identificating a response surface model by calculating an optimum solution O$_i$ for the BSDB$_i$ which is created by the data sampling section 12. For example, the response surface model generation section 14 may generate a response surface model by using a multivariate spline such as biharmonic spline or thin plate spline. The optimum solution search section 15 may search for an optimum solution by using an optimization technique for non-linear functions such as the quasi-Newton method.

The BS response surface model generation section 14 and the optimum solution search section 15 may have substantially the same configuration as the identification apparatus for identificating a response surface model as described in the related art 1. Specifically, the configuration may include a distance calculator, a Green function calculator and a model coefficient calculator. The distance calculator calculates a distance between data items in the space of (N−1) (N is an integer of 2 or above) dimensions which is defined by (N−1) kinds of variates out of N kinds of variates for which data is previously collected by experimental design. The Green function calculator calculates a Green function value corresponding to each distance which is calculated by the distance calculator. The model coefficient calculator obtains an n-dimensional response surface model which approximates the correlation among the N kinds of variates from one kind of data which remains after excluding the (N−1) kinds of data from the collected experimental data and the above-described Green function value.

In the use of such an identification apparatus, a user collects n-number of N-dimensional data characterized by N-kinds of variates by experimental design, for example. Then a user divides the N-kinds of variates into (N−1) kinds of variates and one kind of variate and also divides the N-dimensional data into (N−1) dimensional data and one-dimensional data corresponding thereto, and then inputs the data into the identification apparatus.

Generally, the (N−1) kinds of variates are variates to serve as factors of a solution to be obtained by a user (for example, if a response surface model is generated for optimization of drug formulation, a factor is the amount of each raw material), and the one kind of variate is a variate to serve as a solution (characteristic value of the formulated drug product) It is not necessary that the (N−1) kinds of variates are factors (inputs) and the remaining one kind of variate is solution (output). In this embodiment, however, the (N−1) dimensional data characterized by (N−1) kinds of variates is referred to as input data, and the one-dimensional data characterized by the remaining one kind of variate is referred to as output data for convenience.

Upon input of data by a user, the distance calculator of the identification apparatus calculates Euclidean distance z between each of (N−1) dimensional input data in the (N−1) dimensional space for all combinations of input data and stores the results into a storage unit, which is not shown.

Then, the Green function calculator calculates a corresponding Green function value for each of the Euclidean distances z calculated by the distance calculator and stores the results into a storage unit, which is not shown. The model coefficient calculator calculates a model coefficient (functional parameter) of an N-dimensional response surface model from the output data y and the Green function value and stores the result into a storage unit, which is not shown. The model identification is thereby completed.

In such an identification apparatus, the use of biharmonic spline interpolation based on the Green function as an approximate function of a response surface methodology allows an user to obtain a desired response surface model calculate a BS optimum solution (equation 4) from the BS database 13 expressed by the equation 3. Thus, the optimum solution (the response surface) which is calculated from the BS database 13 containing a given combination of experimental data (bootstrap sample) is the same if the combination of data is the same. As described earlier, the identification of a response surface model by a conventional polynomial model or neural network fails to uniquely determine an optimum solution calculated from a sampling database, thus unable to estimate the reliability. On the other hand, this embodiment enables to uniquely obtain a BS optimum solution, thus allowing the use of the bootstrap for the reliability estimation of an optimum solution search result from a small amount of experimental data so as to estimate an optimum solution.

The BS optimum solution database creation part 18 repeats the process m times, thereby obtaining optimum solutions (functional parameters) $O_1$ to $O_m$ from the m-number of BS databases 13. The BS optimum solution database 16 storing the m number of optimum solutions $O_i$ ($O_1$ to $O_m$) is thereby completed.

Specifically, the BS optimum solution search section 15 or a BS optimum solution database creation completion determination section (not shown) placed in the data processing apparatus, for example, determines if the number of BS optimum solutions which have been stored by repeating the process from the data sampling section 12 to the optimum solution search section 15 reaches a prescribed number m. If it determines that the m number of BS optimum solutions are already stored, the creation of the optimum solution database 16 ends. The number m of BS optimum solutions to be stored in the optimum solution database 16, which is the number m of repeating the process from the data sampling section 12 to the optimum solution search section 15 may be 100 to 300, for example. From the experimental data database expressed by the equation 2, an optimum solution database $O_{DB}$ expressed by the following equation 5 is created:

$$O_{DB} = \begin{cases} O_1 = [X_{(1)O_1}, X_{(2)O_1}, \cdots, X_{(p)O_1}, Y_{(1)O_1}, Y_{(2)O_1}, \cdots, Y_{(q)O_1}] \\ O_2 = [X_{(1)O_2}, X_{(2)O_2}, \cdots, X_{(p)O_2}, Y_{(1)O_2}, Y_{(2)O_2}, \cdots, Y_{(q)O_2}] \\ \vdots \\ O_i = [X_{(1)O_i}, X_{(2)O_i}, \cdots, X_{(p)O_i}, Y_{(1)O_i}, Y_{(2)O_i}, \cdots, Y_{(q)O_i}] \\ \vdots \\ O_m = [X_{(1)O_m}, X_{(2)O_m}, \cdots, X_{(p)O_m}, Y_{(1)O_m}, Y_{(2)O_m}, \cdots, Y_{(q)O_m}] \end{cases} \quad (5)$$

$$\equiv [O_1, O_2, \cdots, O_i, \cdots O_m]^T$$

even if an optimization target is non-linear by using collected data only, without specifying various parameters such as order and structure of the approximate function. This enables the optimum design by the response surface methodology with higher efficiency (reduced labor and time).

In this way, an optimum solution $O_i$ (referred to herein as the BS optimum solution) which is a sampling optimum solution as expressed by the following equation 4 is obtained for the $BSDB_i$ expressed by the equation 3 and stored in the optimum solution database 16.

$$O_i = [X_{(1)O_i}, X_{(2)O_i}, \ldots, X_{(p)O_i}, Y_{(1)O_i}, Y_{(2)O_i}, \ldots, Y_{(q)O_i}] \quad (4)$$

Since this embodiment identifies the response surface model by the spline interpolation, it is possible to uniquely This embodiment repeats the process of creating the BS database 13 from the experimental data DB 11, calculating a BS optimum solution from the BS database 13 and storing the calculated BS optimum solution into the BS optimum solution database 16, thereby creating the BS optimum solution database 16. This process is illustrated in FIG. 2. As shown in FIG. 2, the process creates the m-number of $BSDB_i$ by random sampling from the experimental data DB 11 and then creates the BS optimum solution database 16 by the BS optimum solutions calculated from the $BSDB_i$.

By using the optimum solution database 16 ($O_{DB}$) obtained by the above process, a mean of the BS optimum solutions and a standard deviation of the optimum solutions, which is the variance, are calculated as an optimum solution estimation index. The mean of the BS optimum solutions is a bootstrap estimate, and the variance of the optimum solutions is a bootstrap variance estimate. From the comparison result between the mean of the BS optimum solutions and an optimum solution obtained from the experimental data DB 11, which is referred to herein as the original optimum solution, or the degree of the variance of the BS optimum solutions, the quantity and quality of the experimental data stored in the experimental data DB or the reliability of the original optimum solution in the experimental data DB may be estimated. This embodiment calculates the mean of the BS optimum solutions expressed by the following equation 6 and the standard deviation of the optimum solutions expressed by the following equation 7 from the optimum solution database expressed by the equation 5. The mean of optimum solution database:

using the biharmonic spline, thin plate spline and so on. The response surface model searched and identificated in this way is stored as a BS optimum solution into the BS optimum solution database 16 (Step S13). The process then determines whether a prescribed number of BS optimum solutions are stored in the BS optimum solution database 16, and repeats from the step S11 until the predetermined number of BS optimum solutions are stored. After the prescribed number of BS optimum solutions are stored in the BS optimum solution database 16 and the creation of the BS optimum solution database 16 is completed (Yes in Step S14), the process calculates the mean (equation 6) and the variance (equation 7) of the BS optimum solutions stored in the BS optimum solution database 16 as optimum solution estimation indexes (Step S15).

$$\overline{O_{DB}} = [\overline{X_{(1)O}}, \overline{X_{(2)O}}, \cdots, \overline{X_{(p)O}}, \overline{Y_{(1)O}}, \overline{Y_{(2)O}}, \cdots, \overline{Y_{(q)O}}] \quad (6)$$

$$= \left[ \frac{\sum_{i=1}^{m} X_{(1)O_i}}{m}, \frac{\sum_{i=1}^{m} X_{(2)O_i}}{m}, \cdots, \frac{\sum_{i=1}^{m} X_{(p)O_i}}{m}, \frac{\sum_{i=1}^{m} Y_{(1)O_i}}{m}, \frac{\sum_{i=1}^{m} Y_{(2)O_i}}{m}, \cdots, \frac{\sum_{i=1}^{m} Y_{(q)O_i}}{m} \right]$$

The standard deviation of optimum solution database:

$$\sigma_{O_{DB}} = [\sigma_{X_{(1)O}}, \sigma_{X_{(2)O}}, \cdots, \sigma_{X_{(p)O}}, \sigma_{Y_{(1)O}}, \sigma_{Y_{(2)O}}, \cdots, \sigma_{Y_{(q)O}}] \quad (7)$$

$$= \left[ \sqrt{\frac{\sum_{i=1}^{m}(X_{(1)O_i} - \overline{X_{(1)O}})^2}{m}}, \sqrt{\frac{\sum_{i=1}^{m}(X_{(2)O_i} - \overline{X_{(2)O}})^2}{m}}, \cdots, \right.$$

$$\left. \sqrt{\frac{\sum_{i=1}^{m}(X_{(p)O_i} - \overline{X_{(p)O}})^2}{m}}, \sqrt{\frac{\sum_{i=1}^{m}(Y_{(1)O_i} - \overline{Y_{(1)O}})^2}{m}}, \sqrt{\frac{\sum_{i=1}^{m}(Y_{(2)O_i} - \overline{Y_{(2)O}})^2}{m}}, \cdots, \sqrt{\frac{\sum_{i=1}^{m}(Y_{(q)O_i} - \overline{Y_{(q)O}})^2}{m}} \right]$$

Figure 3:
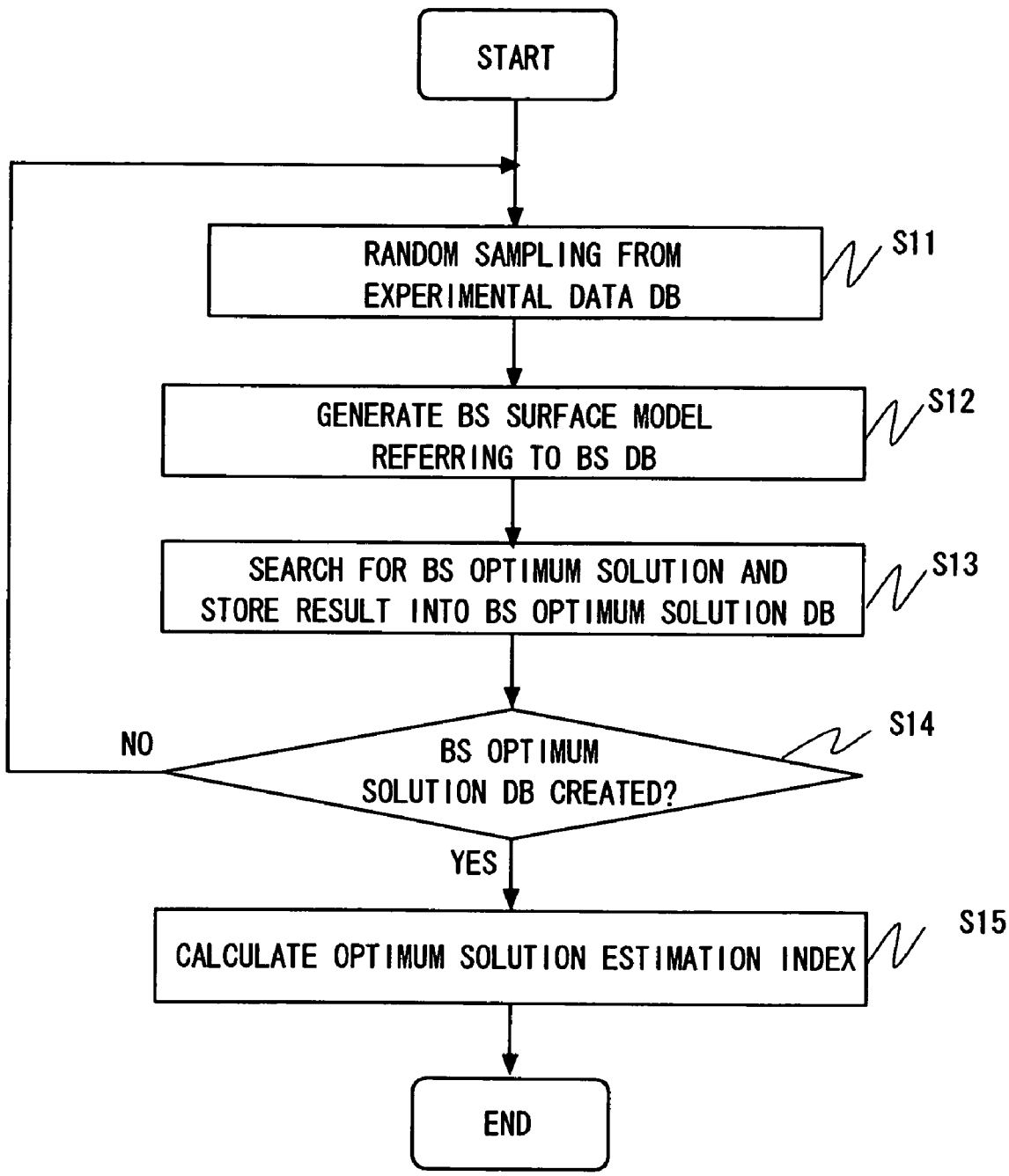
FIG. 3 is a flowchart showing a data processing method to estimate the reliability of an optimum solution according to the first embodiment of the invention.

FIG. 3 is a flowchart showing the data processing method according to this embodiment. In order to estimate the original optimum solution (response surface model) obtained from the experimental data collected in the experimental data DB 11, the process first creates a BS database by random sampling from the experimental data DB 11 (Step S11). This embodiment randomly samples n-number of experimental data from the n-number of experimental data in the experimental data DB 11 by generating random numbers, thereby creating a BS database. The sampling allows repeated selection of a data item. This enables to accurately estimate an optimum solution to be calculated even from the experimental data DB 11 containing a small amount of experimental data. Though this embodiment creates the BS database 13, whether to allow the repeated selection or the number of experimental data items to be sampled are not limited to those described above. Thus, the sampling may not allow the repeated selection, or the number of sampled items may be larger or smaller than n.

The process then generates a response surface model (referred to herein as the BS response surface model) from the experimental data in the BS database (Step S12). This embodiment can automatically generate an approximate function (reference surface model) which is necessary for optimum design even for a non-linear optimization target by In this embodiment, according to the bootstrap theory, the mean (equation 6) of the BS optimum solutions stored in the BS optimum solution database 16 serves as a true optimum condition (optimum solution) of a design target. From the standard deviation a (equation 7) of the optimum solutions, the reliability (3σ; 99% reliability) of the true optimum condition (optimum solution) may be assumed to 3σ. It is thereby possible to quantitatively estimate the variation (reliability) of the optimum solution by the standard deviation σ serving as the optimum solution estimation index, thus enabling appropriate design in consideration of the risk due to variations and the safety factor of a product based on the optimum solution estimation index.

The statistical approximate error which is used as an estimate of a conventional linear regression model requires calculation of F value as described earlier. However, a large amount of data that is statistically sufficient is necessary to calculate the F value accurately. On the other hand, this embodiment enables the accurate estimation of a optimum solution with a less amount of data by way of creating the BS optimum solution database. It is thus effective for a design target where it is difficult to collect a large amount of experimental data. Further, this embodiment enables the estimation of the reliability of an optimum solution even if a target is such that the correlation (response) between design conditions and product characteristics is complex non-linear response surface. Hence, this embodiment allows accurately estimating the reliability of an optimum solution for a response surface model, regardless of a linear regression model or a non-linear regression model, as long as a design target does not depend on a distribution factor which is different from variations in experimental data.

which is collected data for variate estimation, is represented as $d^{(k)}$, and the database containing the experimental data $d^{(k)}$ excluding a remarkable design factor $X_{(k)}$, which is a collection database for variate estimation, is represented as the rebuilt database 22 ($DB^{(X_k)}$). The rebuilt data $DB^{(X_k)}$ which is rebuilt from the experimental data DB of the equation 2 may be expressed as the following equation 8:

$$DB^{(X_k)} = \begin{cases} d_1^{(k)} = [X_{(1)1}, X_{(2)1}, \cdots, X_{(k-1)1}, X_{(k+1)1}, \cdots, X_{(p)1}, Y_{(1)1}, Y_{(2)1}, \cdots, Y_{(q)1}] \\ d_2^{(k)} = [X_{(1)2}, X_{(2)2}, \cdots, X_{(k-1)2}, X_{(k+1)2}, \cdots, X_{(p)2}, Y_{(1)2}, Y_{(2)2}, \cdots, Y_{(q)2}] \\ \vdots \\ d_j^{(k)} = [X_{(1)j}, X_{(2)j}, \cdots, X_{(k-1)j}, X_{(k+1)j}, \cdots, X_{(p)j}, Y_{(1)j}, Y_{(2)j}, \cdots, Y_{(q)j}] \\ \vdots \\ d_n^{(k)} = [X_{(1)n}, X_{(2)n}, \cdots, X_{(k-1)n}, X_{(k+1)n}, \cdots, X_{(p)n}, Y_{(1)n}, Y_{(2)n}, \cdots, Y_{(q)n}] \end{cases} \quad (8)$$

$$\equiv [d_1^{(k)}, d_2^{(k)}, \cdots, d_j^{(k)}, \cdots, d_n^{(k)}]^T$$

If there is a significant divergence between the original optimum solution O which is calculated by using the entire experimental data database and the mean of the optimum solution in the BS optimum solution database 16, it can be determined that the collected experimental data stored in the experimental data DB 11 is insufficient for use as a sample for optimum solution search. It is thereby possible to estimate the quality and quantity of experimental data in the experimental data DB 11 as described later. Also as described later, more appropriate and efficient data collection or the like is possible by calculating the contribution of each design factor (design condition) to an optimum solution.

Figure 4A:
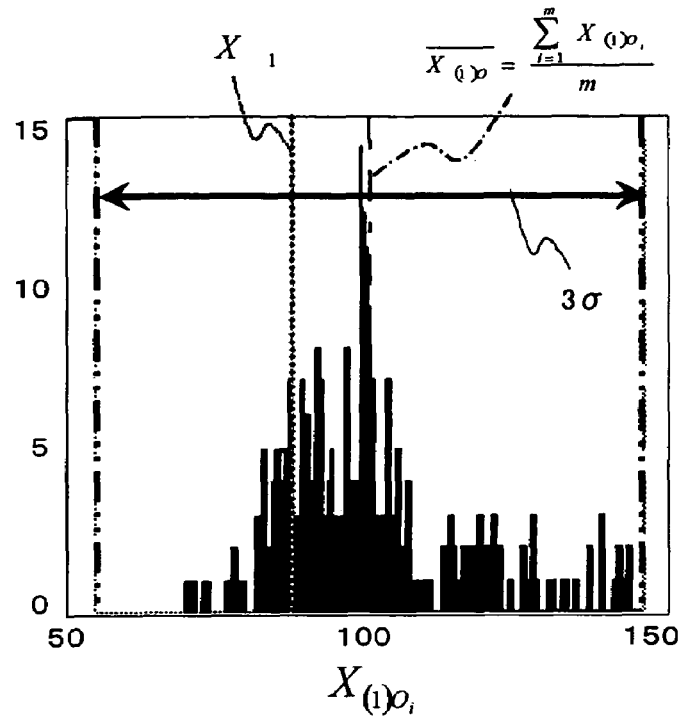
FIGS. 4A to 4C are views showing the results of estimating the reliability according to the first embodiment of the invention.
Figure 4B:
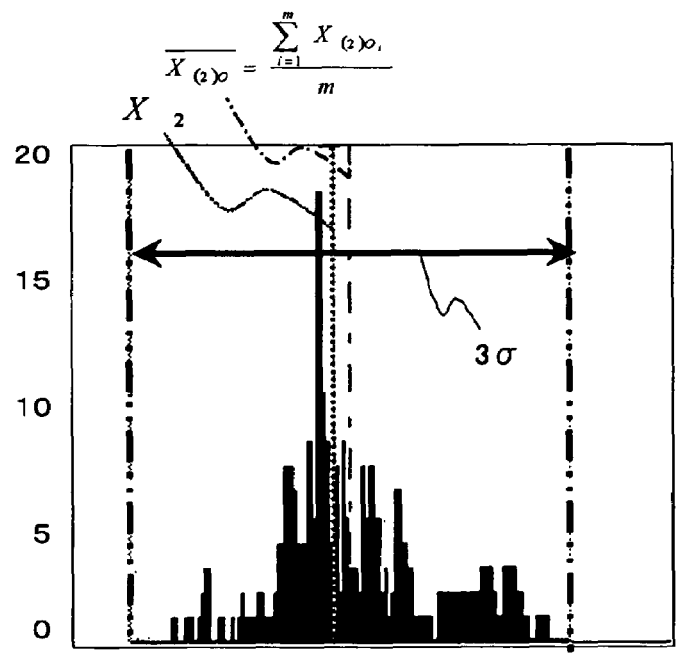
Figure 4C:
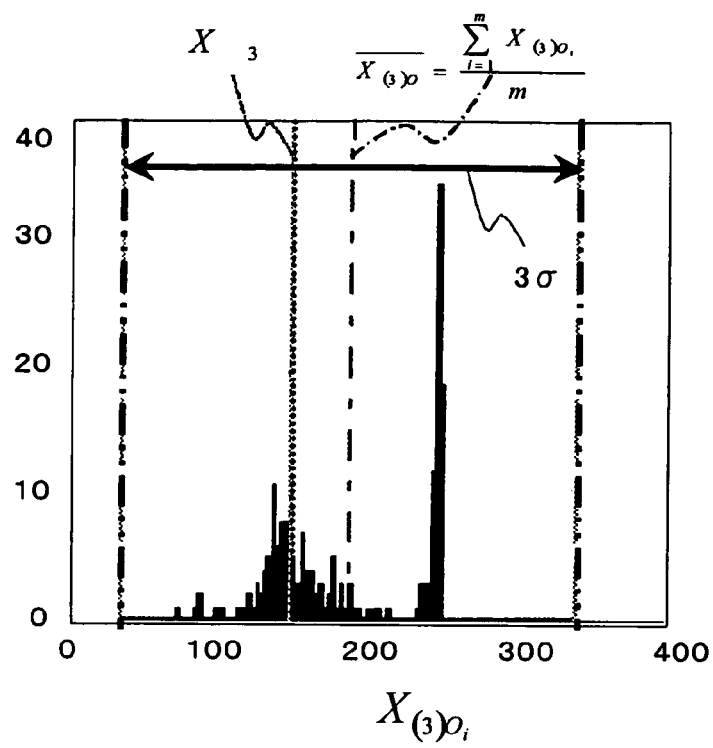
Figure 5A:
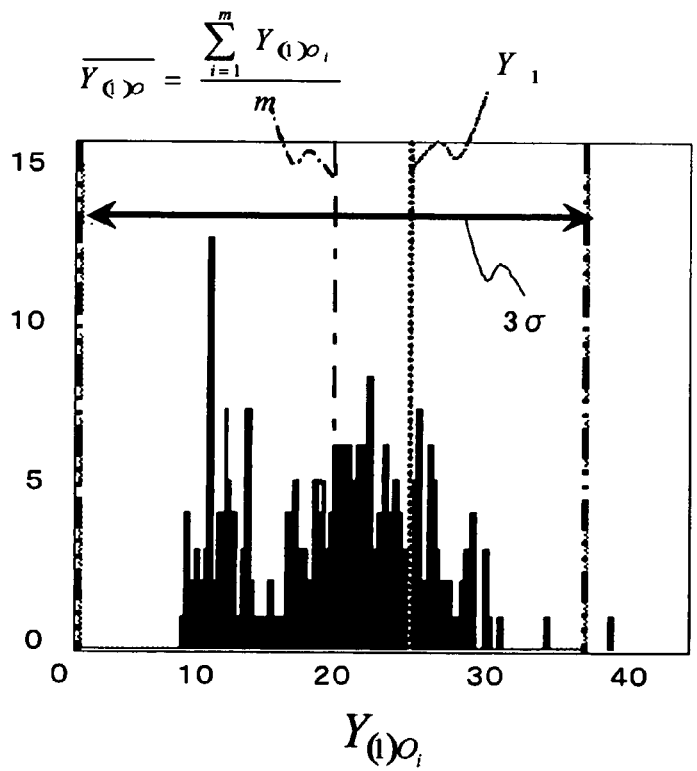
FIGS. 5A to 5C are views showing the results of estimating the reliability according to the first embodiment of the invention.
Figure 5B:
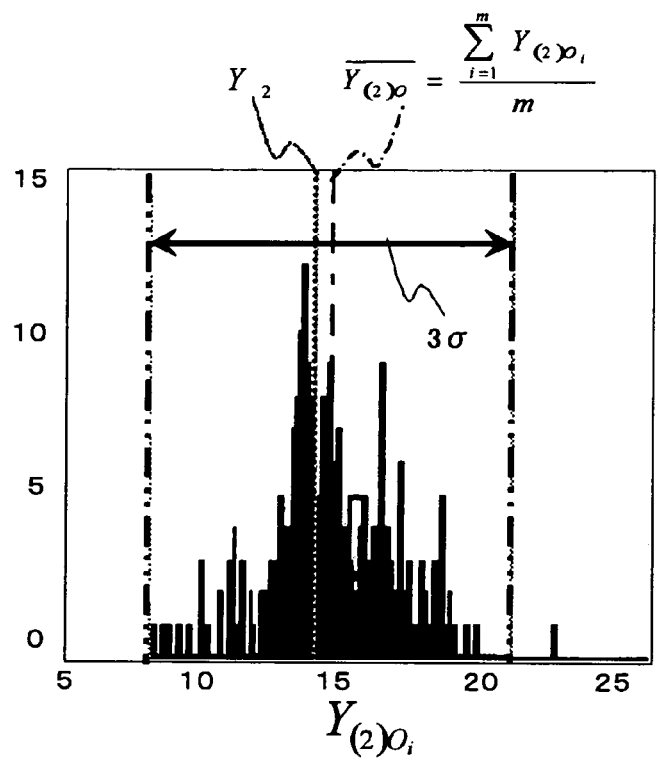
Figure 5C:
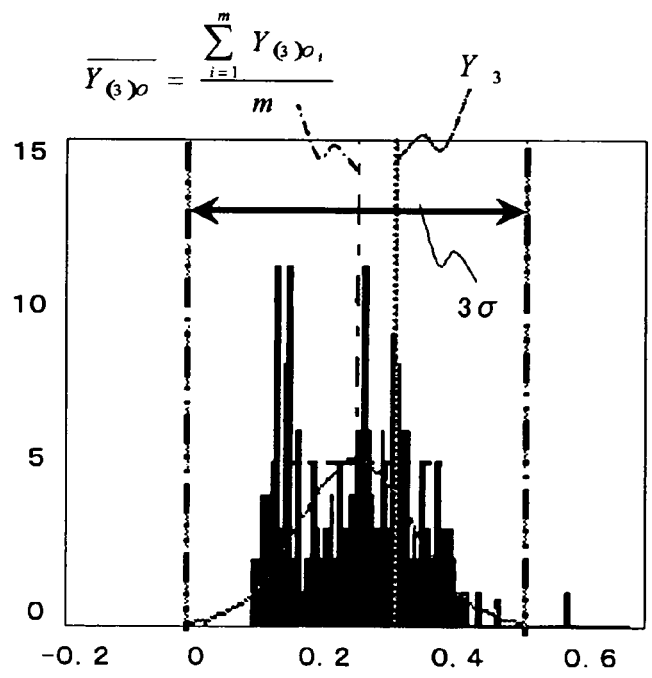

An example of the result of reliability estimation according to this embodiment is described herein. FIGS. 4A to 4C and 5A to 5C are graphs showing the mean (equation 6) of BS optimum solutions and the variation 3σ (standard deviation a; equation 7), and the original optimum solutions obtained from the entire experimental data in the experimental data DB. FIGS. 4A to 4C show the case where the design factors, such as design conditions, $X_{(1)}$ to $X_{(p)}$ are $X_{(1)}$ to $X_{(3)}$. FIGS. 5A to 5C show the case where the characteristics values, such as product specifications, $Y_{(1)}$ to $Y_{(p)}$ are $Y_{(1)}$ to $Y_{(3)}$. $X_1$, $X_2$ and $X_3$ in FIG. 4 and $Y_1$, $Y_2$ and $Y_3$ in FIG. 5 are original optimum solutions. The graphs show that the divergence between the mean of the BS optimum solutions and the original optimum solution is smallest at $X_{(2)Oi}$ in FIG. 4, and it is smallest at $Y_{(2)Oi}$ in FIG. 5, for example.

Second Embodiment

Figure 6:
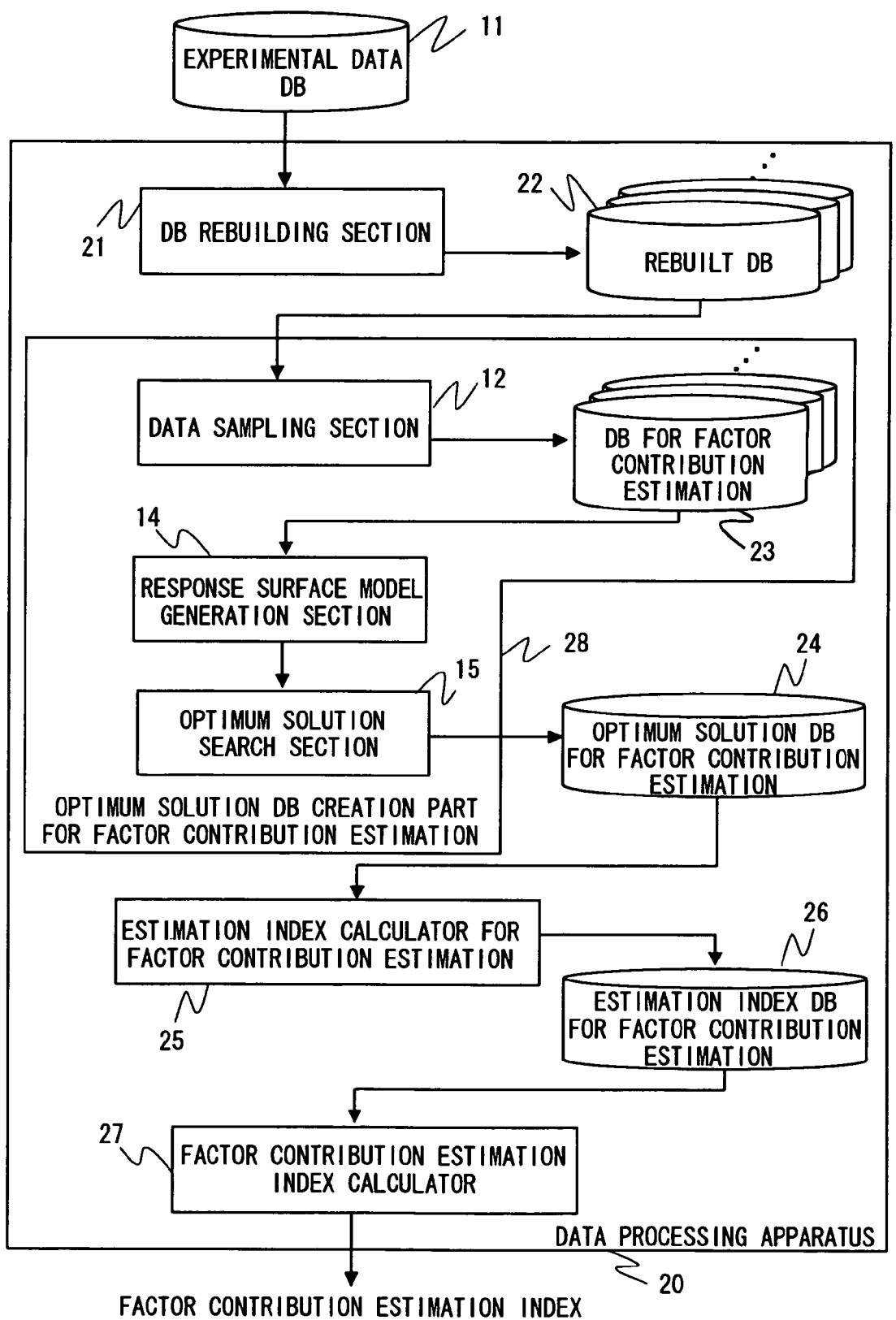
FIG. 6 is a block diagram showing a data processing apparatus according to a second embodiment of the invention.

FIG. 6 is a block diagram showing the data processing apparatus according to the second embodiment of the invention. As shown in FIG. 6, the data processing apparatus 20 of this embodiment includes a database rebulding section 21 in addition to the data processing apparatus 10 of the first embodiment. It performs a process similar to that in the data processing apparatus 10 for a rebuilt database 22, thereby implementing factorial analysis (significance estimation of design variable) of a response surface model.

The data database rebuilding section 21 rebuilds an experimental data database, which is referred to herein as the rebuilt data DB, 22 that excludes a remarkable design factor $X_{(k)}$ (k is an integer of 1 to p) based on the experimental data DB of the equation 2. In this specificaton, the experimental data from which a remarkable design factor $X_{(k)}$ is excluded, The optimum solution database creation part 18 in the first embodiment creates the optimum solution database 16 from the experimental data DB 11. On the other hand, the optimum solution DB for factor contribution estimation creation part 28 in this embodiment calculates an optimum solution from the rebuilt data DB 22 and creates a database storing the calculated results, which is referred to herein as the optimum solution DB 24 for factor contribution estimation. The data processing apparatus 20 of this embodiment includes an estimation index calculator 25 for factor contribution estimation instead of the optimum solution estimation index calculator 17. The estimation index calculator 25 for factor contribution estimation calculates the mean (following equation 9) and the standard deviation (following equation 10) of the optimum solution (referred to herein as the factor contribution estimation optimum solution) which is generated from the rebuilt data DB 22 excluding a design factor $X_{(k)}$ and stored in the optimum solution DB 24 for factor contribution estimation as an estimation index (referred to herein as the factor contribution estimation index). In this embodiment, it is referred to as the factor contribution estimation index$^{(X_k)}$ which is obtained from the optimum solution DB 24 for factor contribution estimation created from the rebuilt data $DB^{(X_k)}$.

The estimation index$^{(X_k)}$ for factor contribution estimation

The mean of optimum solutions for factor contribution estimation:

$$\overline{O_{DB^{(X_k)}}} = \left[ \overline{X_{(1)O^{(k)}}}, \overline{X_{(2)O^{(k)}}}, \cdots, \overline{X_{(k-1)O^{(k)}}}, \overline{X_{(k+1)O^{(k)}}}, \cdots, \overline{X_{(p)O^{(k)}}}, \overline{Y_{(1)O^{(k)}}}, \overline{Y_{(2)O^{(k)}}}, \cdots, \overline{Y_{(q)O^{(k)}}} \right] \quad (9)$$

The standard deviation (variation) of optimum solutions for factor contribution estimation:

$$\sigma_{O_{DB^{(X_k)}}} = \Big[ \sigma_{X_{(1)O^{(k)}}}, \sigma_{X_{(2)O^{(k)}}}, \cdots, \sigma_{X_{(k-1)O^{(k)}}}, \cdots, \sigma_{X_{(k+1)O^{(k)}}}, \cdots, \sigma_{X_{(p)O^{(k)}}}, \sigma_{Y_{(1)O^{(k)}}}, \sigma_{Y_{(2)O^{(k)}}}, \cdots, \sigma_{Y_{(q)O^{(k)}}} \Big] \quad (10)$$

The above equations 9 and 10 represent the reliability of the factor contribution estimation optimum solution$^{(Xk)}$ without the consideration of a design factor $X_{(k)}$. As the significance of the design factor $X_{(k)}$ is high, the factor contribution estimation optimum solution$^{(Xk)}$ without containing the data of design factor $X_{(k)}$ is unstable. This indicates a decrease in reliability, and the variation in the factor contribution estimation optimum solution$^{(Xk)}$ increases accordingly. Thus, the factor contribution estimation optimum solution$^{(Xk)}$ of the equations 9 and 10 indicate the significance (contribution) of a design factor $X_{(k)}$.

The data processing apparatus 20 of this embodiment further includes an estimation index database 26 for factor contribution estimation and a factor contribution estimation index calculator 27. The estimation index database 26 for factor contribution estimation stores factor contribution optimum solution estimation indexes calculated by the estimation index calculator 25 for factor contribution estimation as needed. Specifically, the database rebuilding section 21 repeats from k=1 to k=p for each design factor $X_{(k)}$ as the rebuilt database 22 and repeats the above process for all design factors $X_{(k)}$ (k=1, 2, 3, . . . to p), thereby obtaining the following equations 11 and 12:

An estimation index$^{(Xk)(k=1\ to\ p)}$ for factor contribution estimation

The mean of an optimum solution $^{(Xk)(k=1\ to\ p)}$ for factor contribution estimation:

$$\overline{O_{DB}(X_p)}(k=1,2,3,\ldots,p) \qquad (11)$$

The standard deviation of an optimum solution $^{(Xk)(k=1\ to\ p)}$ for factor contribution estimation:

$$\sigma O_{DB}(X_p)(k=1,2,3,\ldots,p) \qquad (12)$$

The database (estimation index DB for factor contribution estimation) 26 which stores estimation index$^{(Xk)(k=1\ to\ p)}$ for factor contribution estimation excluding each of design factors $X_{(k)}$ (k=1, 2, 3, . . . to p) is thereby obtained.

The factor contribution estimation index calculator 27 estimates the degree of incidence (significance) of each design factor X from the comparison result (referred to herein as the factor contribution estimation index) between the reliability estimation index (equations 6 and 7) when using all design factors calculated in the same way as in the first embodiment and the solution estimation index $^{(Xk)(k=1\ to\ p)}$ for factor contribution estimation (equations 11 and 12) when excluding the above factors $X_{(k)}$.

The comparison may be made by a method of calculating a difference in the standard deviation of an optimum solution for each design factor $X_{(k)}$ or a ratio expressed by the following equation 13:

Factor contribution estimation index $$R_{(X_k)} = \left[\frac{\sigma Y_{(1)O}(X_k)}{\sigma Y_{(1)O}}, \frac{\sigma Y_{(2)O}(X_k)}{\sigma Y_{(2)O}}, \cdots, \frac{\sigma Y_{(q)O}(X_k)}{\sigma Y_{(q)O}}\right] \qquad (13)$$

By calculating the factor contribution estimation index $R_{(Xk)}$ for each design factor $X_{(k)}$ as expressed in the equation 13 about each of the characteristic values $Y_{(1)}$ to $Y_{(q)}$, it is possible to estimate the significance (contribution) of the design factor for each cahracteristics.

Specifically, for the characteristic value $Y_{(1)}$, the factor contribution estimation indexes $R_{(X1)}$ to $R_{(Xp)}$ of the design factors $X_{(1)}$ to $X_{(p)}$ are as follows:

$$(R_{(X_1)}, R_{(X_2)}, \cdots, R_{(X_p)}) = \left(\frac{\sigma Y_{(1)O}(X_1)}{\sigma Y_{(1)O}}, \frac{\sigma Y_{(1)O}(X_2)}{\sigma Y_{(1)O}}, \cdots, \frac{\sigma Y_{(1)O}(X_p)}{\sigma Y_{(1)O}}\right) \qquad (14)$$

Similarly, for the characteristic value $Y_{(2)}$, the factor contribution estimation indexes $R_{(X1)}$ to $R_{(Xp)}$ of the design factors $X_{(1)}$ to $X_{(p)}$ are as follows:

$$(R_{(X_1)}, R_{(X_2)}, \cdots, R_{(X_p)}) = \left(\frac{\sigma Y_{(2)O}(X_1)}{\sigma Y_{(2)O}}, \frac{\sigma Y_{(2)O}(X_2)}{\sigma Y_{(2)O}}, \cdots, \frac{\sigma Y_{(2)O}(X_p)}{\sigma Y_{(2)O}}\right) \qquad (15)$$

Also similarly, for the characteristic value $Y_{(q)}$, the factor contribution estimation indexes $R_{(X1)}$ to $R_{(Xp)}$ of the design factors $X_{(1)}$ to $X_{(p)}$ are as follows:

$$(R_{(X_1)}, R_{(X_2)}, \cdots, R_{(X_p)}) = \left(\frac{\sigma Y_{(q)O}(X_1)}{\sigma Y_{(q)O}}, \frac{\sigma Y_{(q)O}(X_2)}{\sigma Y_{(q)O}}, \cdots, \frac{\sigma Y_{(q)O}(X_p)}{\sigma Y_{(q)O}}\right) \qquad (16)$$

By comparing the values of the equations 14 to 16 and so on, it is possible to estimate the significance (which is an index corresponding to the contribution ratio of a linear regression model) of each design factor $X_{(k)}$, thus allowing the factorial analysis even for a non-linear response surface model.

Figure 7:
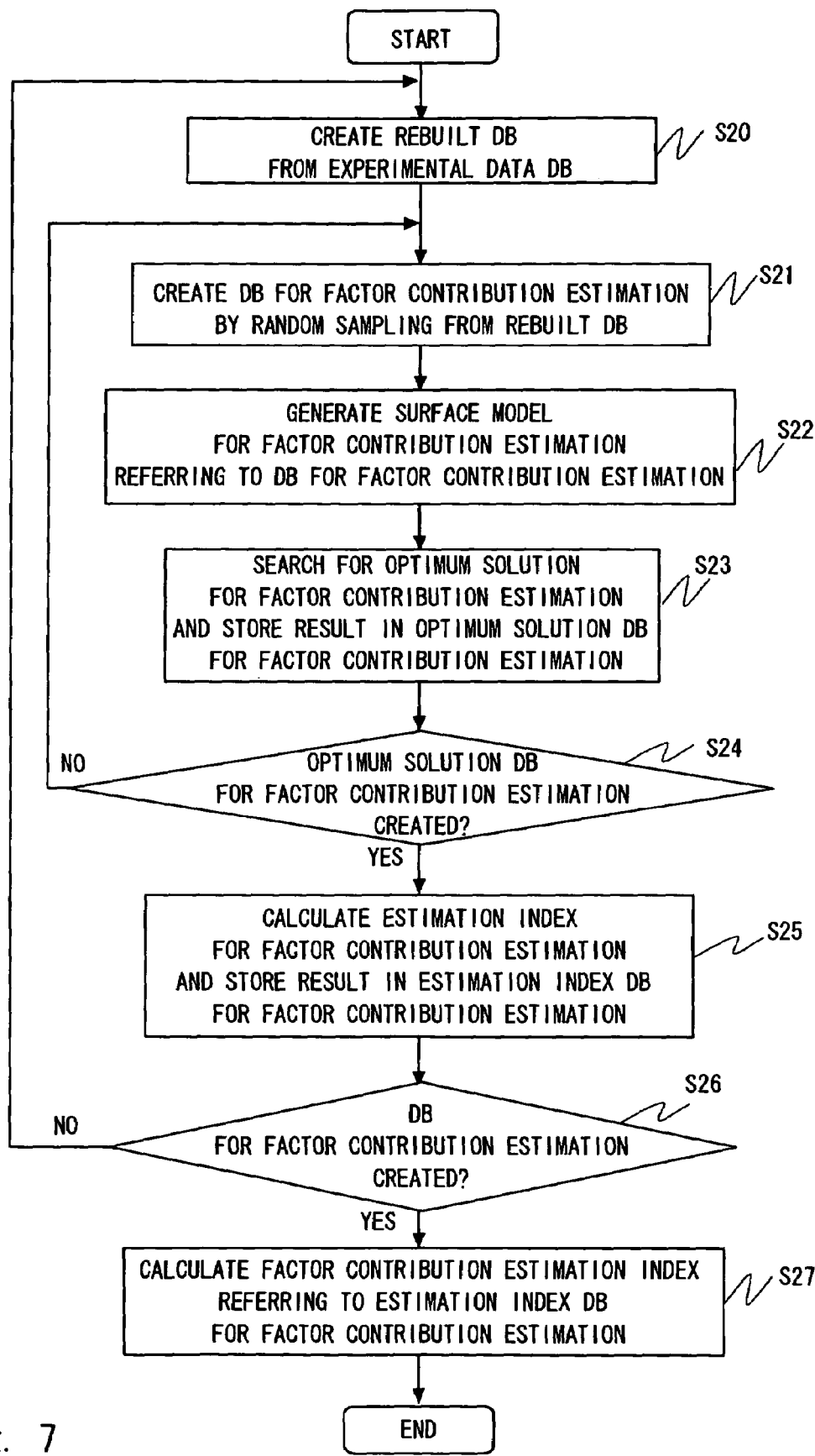
FIG. 7 is a flowchart showing a data processing method to estimate the degree of factor contribution according to the second embodiment of the invention.

The method of estimating factor contribution is described herein. FIG. 7 is a flowchart showing the estimation method of factor contribution. As shown in FIG. 7, the process first creates the rebuilt data DB 22 which contains the experimental data excluding a prescribed factor from each experimental data stored in the experimental data DB 11 (Step S20). One or a plurality of factors may be excluded from each experimental data. Then, the process of Steps S21 to S25 is performed on the rebuilt data DB 22 in the same way as the Steps S11 to S15 of the first embodiment.

Specifically, the process first creates a database 23 for factor contribution estimation by random sampling from the rebuilt data DB 22 (Step S21). Then, it generates a response surface model (response surface model for contribution estimation) in reference to the database 23 for factor contribution estimation and searches for an optimum solution of the model (optimum solution for contribution estimation) (Steps S22 and S23). The obtained optimum solution for factor contribution estimation is stored into the optimum solution database 24 for factor contribution estimation. The process from S21 to S23 is repeated a preset number (=m) of times, thereby creating the optimum solution database 24 for factor contribution estimation which stores the m-number of optimum solutions for factor contribution estimation (Step S24). The estimation index calculator 25 for factor contribution estimation calculates an estimation index in the case of excluding a particular factor from experimental data as expressed by the equations 11 and 12 as a factor contribution estimation index in reference to the created optimum solution database 24 for factor contribution estimation. It then stores the calculated results into the estimation index database 26 for factor contribution estimation. The process repeats Steps S20 to S25, and upon completion of the process from S20 to S25 for all factors (Yes in Step S26), the estimation index database 26 for factor contribution estimation is completed. The factor contribution estimation index calculator 27 calculates a factor contribution estimation index as described earlier in reference to the estimation index database 26 for factor contribution estimation and outputs the calculated result (Step S27).

Figure 8A:
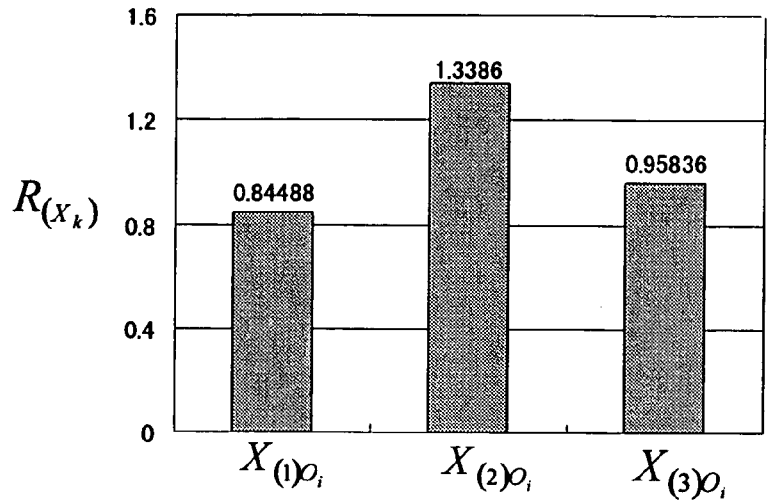
FIGS. 8A to 8C are graphs showing the results of calculating the degree of contribution of design factor for each characteristic value by the method according to the second embodiment of the invention.
Figure 8B:
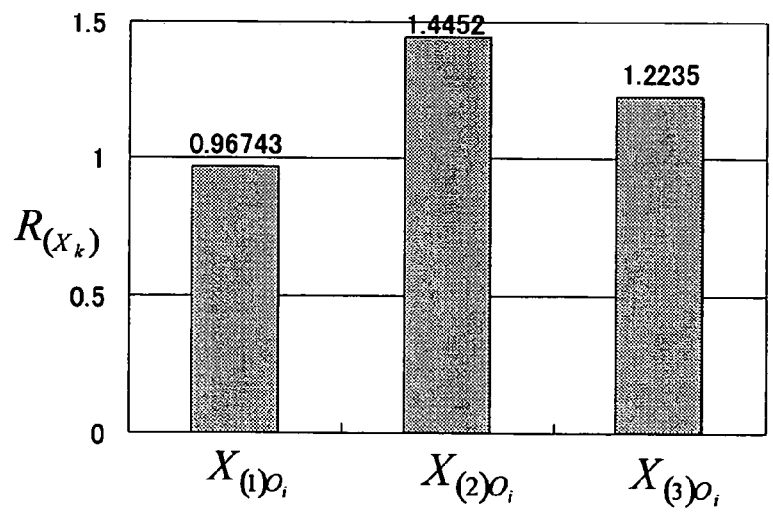
Figure 8C:
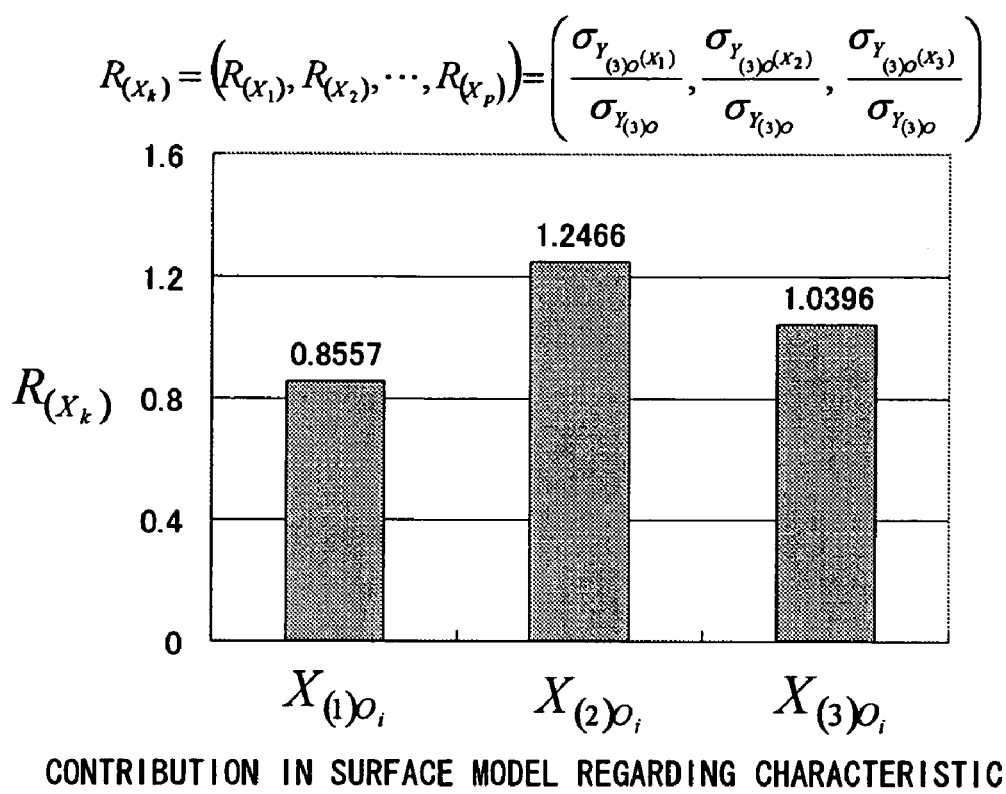

An example of the result of the data processing method according to this embodiment is described herein. FIGS. 8A to 8C are the graphs showing the calculation results obtained by the method of this embodiment. The graphs indicate the degree of contribution of design factors $X_{(1)}$ to $X_{(3)}$ for the characteristucs values $Y_1$, $Y_2$ and $Y_3$ as an example of variance ratio. In this example, the design factor $X_{(2)}$ indicates the largest contribution for any of the characteristucs values $Y_1$, $Y_2$ and $Y_3$. Given such results, it is feasible to design a response surface model in which the design factor with a significantly small contribution is eliminated or in which a design factor with a large contribution is weight, for example.

Third Embodiment

Figure 9:
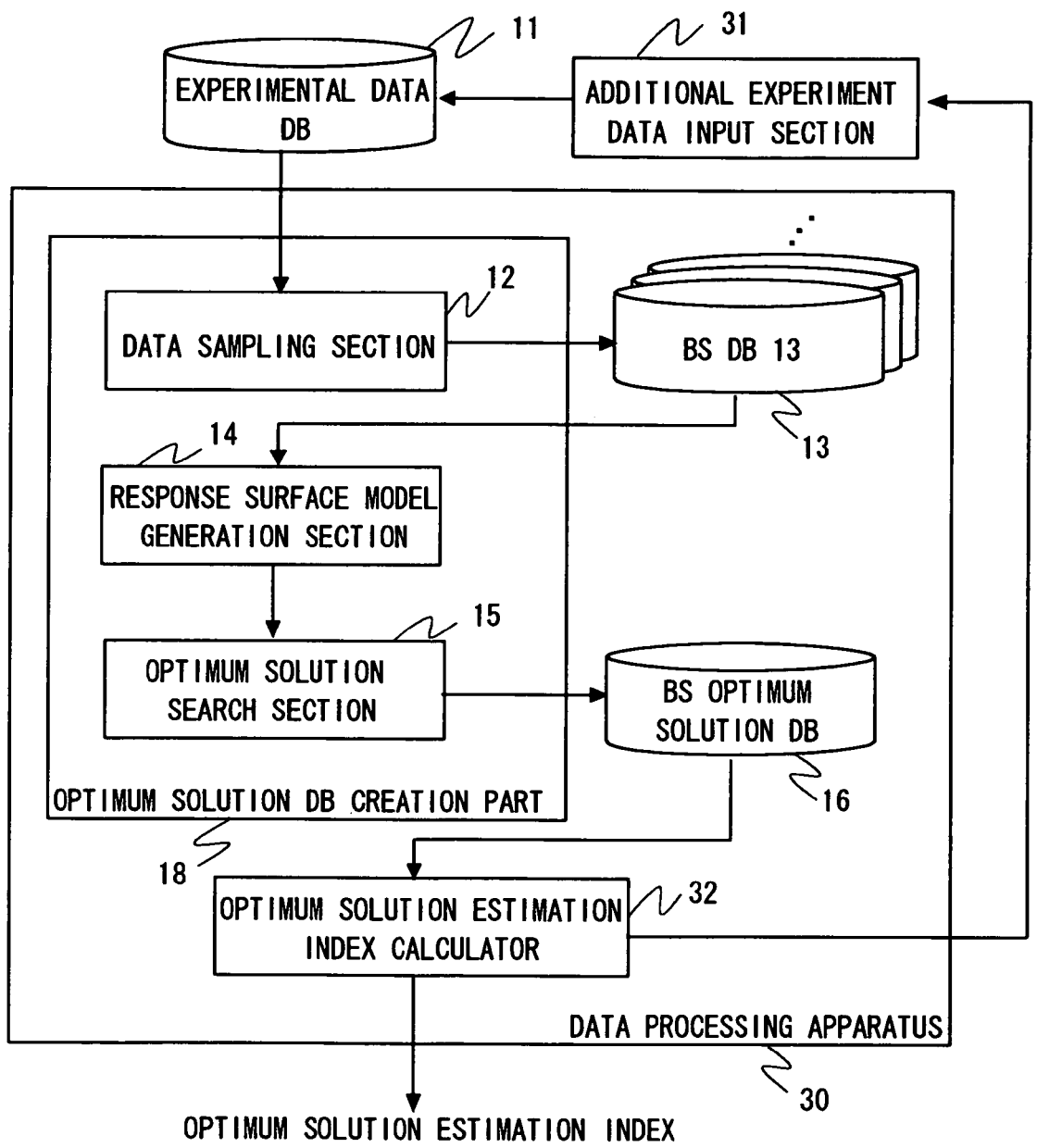
FIG. 9 is a block diagram showing a data processing apparatus according to a third embodiment of the invention.

A third embodiment is described hereinbelow. FIG. 9 is a block diagram showing the data processing apparatus according to the third embodiment of the present invention. In addition to the structure in the first embodiment, the data processing apparatus 30 of this embodiment includes an optimum solution estimation index calculator 32 for quantitatively estimating the quality of the experimental data DB 11 based on an optimum solution reliability estimation index. The third embodiment implements an additional experiment efficiently based on the optimum solution estimation index calculator 32.

As shown in FIG. 9, the optimum solution estimation index calculator 32 has a function that the reliability estimation index, particularlly the mean (equation 6) of BS optimum solutions, which is obtained by the same way as the first embodiment, compares a response surface model (original optimum solution) identified by using the whole experimental data of the experimental data DB 11.

If there is a significant divergence between the optimum solution estimation index (equations 6 and 7) and the original optimum solution, it can be determined that the experimental data (sample) collected in the experimental data DB 11 has been insufficient for obtaining an optimum solution. In this case, this embodiment newly collects experimental data and rebuilds the experimental data DB 11 as described later. Thus, by monitoring the degree of divergence (difference, ratio or the like), it is possible to quantitatively estimate the quality of the experimental data, thereby determining the need for additional experiment. Though this determination is implemented by the optimum solution estimation index calculator 32 in this embodiment, it is not limited thereto. It is thus feasible to add a determination section or the like as long as the comparison of the optimum solution index calculated by the optimum solution estimation index calculator 32 with the original optimum solution and the determination are possible.

The determination may be made by a method of determining whether the divergence exceeds a predetermined threshold or not, for example. It is also feasible to use the standard deviation σ of the optimum solution estimation index obtained from the BS optimum solution database 16 to make determination by setting 3σ or higher divergence as a threshold.

If it is determined by the optimum solution estimation index calculator 32 or a determination section (not shown) that there is the need for additional experiment because of the divergence being a predetermined threshold or higher, for example, an additional experiment data input section 31 is used to implement a new experiment and update the experimental data DB 11. The additional experiment data input section 31 is connected to the outside, for example, and implement an additional experiment. Alternatively, it is feasible to output suitable experimental data to add so that a user performs an additional experiment according to the output result and input the experimental data.

The additional experimental data may be a value close to the mean (equation 6) of BS optimum solutions. This enables to perform an additional experiment efficiently, though a conventional technique has performed an additioal experiment with varying design conditions by trial and error. The additional experimental data may be only the experimental data under the design conditions to be the mean of bootstrap optimum solutions. Alternatively, inconsideration of variations or standard deviation (equation 7) of optimum solutions, it is feasible to collect several experimental data sets where design conditions are varied within the above variations.

The above-described method enables to appropriately figure out the experimental data to be added, though a conventional method blindly performs additional experiment, and thereby efficiently implements an additional experiment and estimates the reliability of an optimum solution. It is therefore possible to achieve the efficient and optimum product design.

Figure 10:
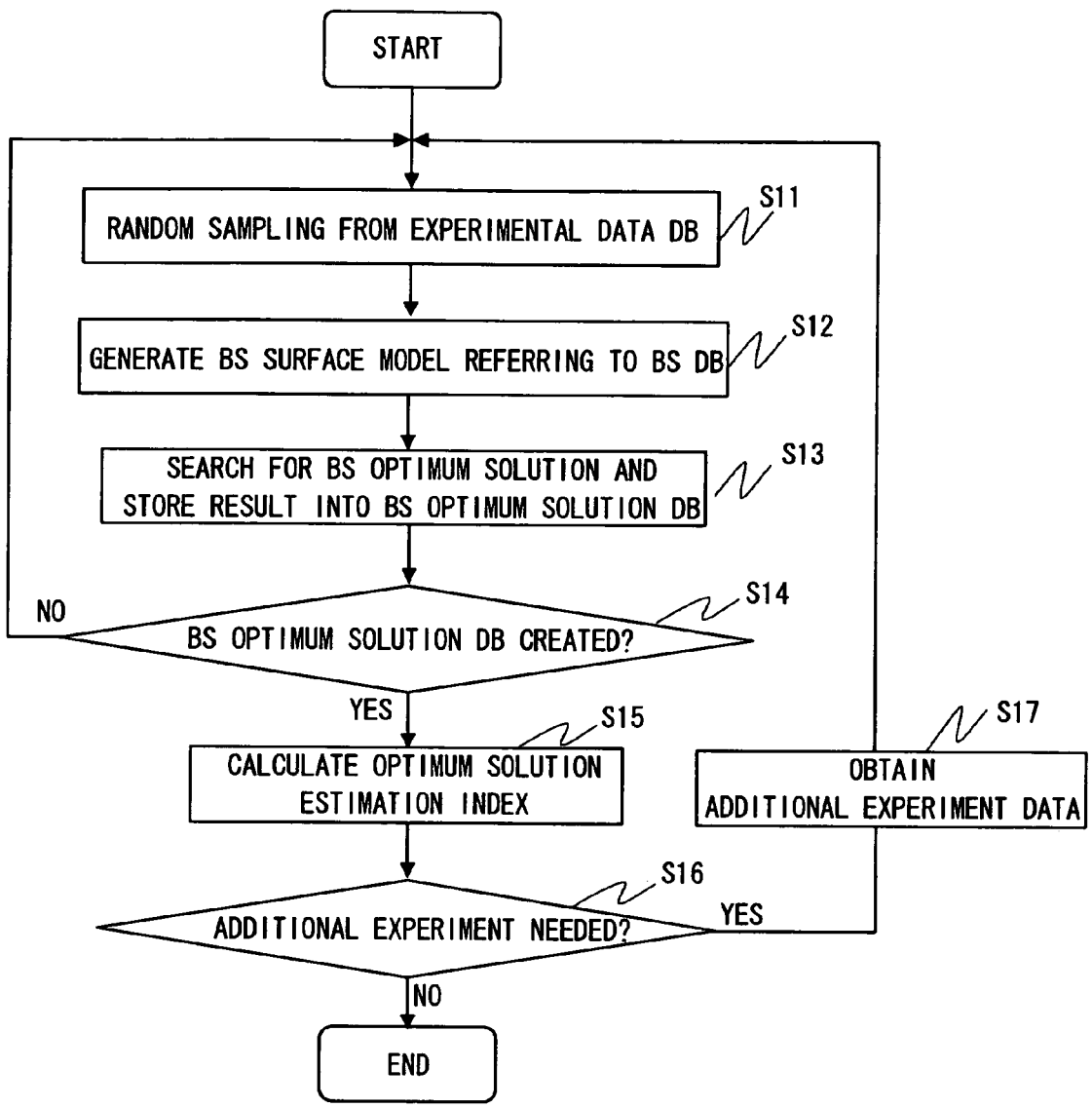
FIG. 10 is a flowchart showing a data processing method to determine the need for an additional experiment according to the third embodiment of the invention.
Figure 11:
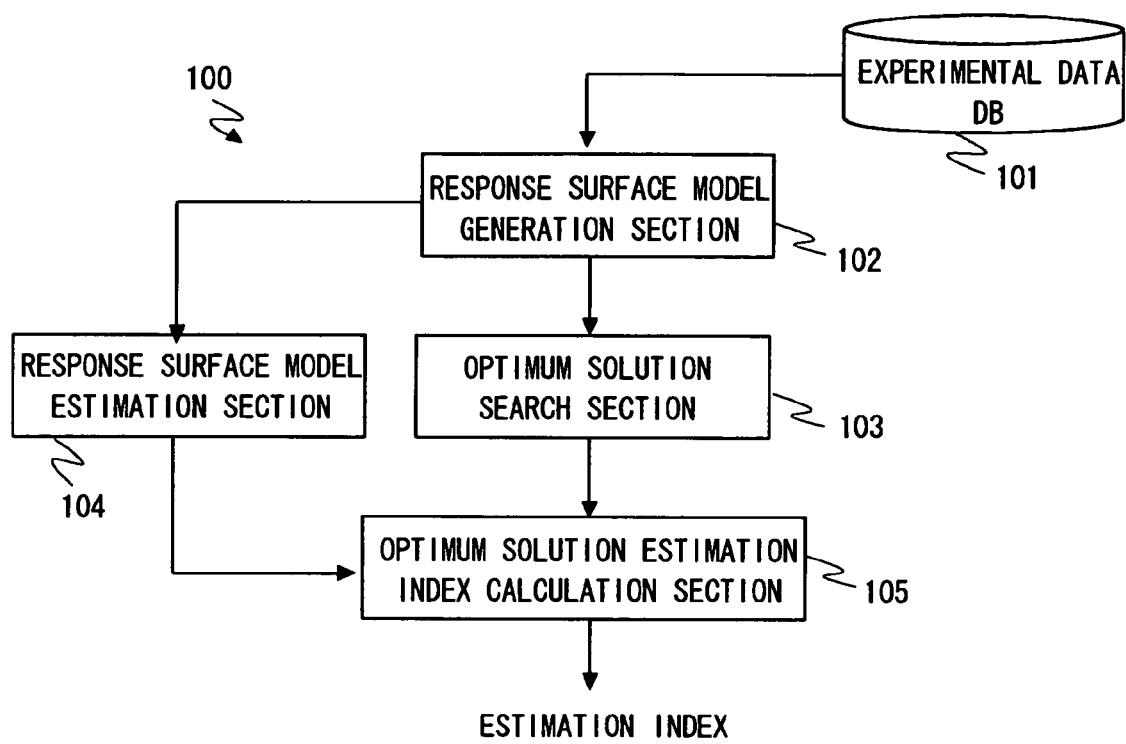
FIG. 11 is a block diagram showing a conventional response surface model identification apparatus.

FIG. 10 is a flowchart showing the operation according to this embodiment. As shown in FIG. 10, the process from S11 to S15 is the same as in the first embodiment. After calculating the optimum solution estimation index in Step S15, the process examines the divergence between the optimum solution estimation index (equations 6 and 7) and the original optimum solution and determine whether an additional experiment is needed (S16). If an additional experiment is needed, the process acquires additional experiment data (S17) and repeats the process from Step S11.

Performing an additional experiment and repeating the process from Step S11 after rebuilding the experimental data DB 11 enable to estimate the quality and quantity of the experimental data stored in the experimental data DB 11 after the additional experiment. Further, adding a single or a plurality of experimental data items in Step S17 enables to obtain the experimental data DB with assured quality and quantity from an extremely small amount of additional experimental data.

Further, in combination with the second embodiment described above, for the experimental data having a large number of factors, performing the estimation of the optimum solution or the experimental data DB by using the factors with high contribution only further increases the efficiency.

The present invention Is not limited to the above-described embodiments but may be altered in various ways without departing from the scope of the present invention. For example, though the above embodiments are described in connection with the hardware configuration, it is not limited thereto. For example, it is feasible to implement prescribed processing by a central processing unit (CPU) of a computer executing computer program. The computer may have a well-known configuration including CPU, ROM, RAM, display, circuit for interface with a keyboard or an external storage unit and so on. The computer executes processing according to the program stored in ROM or RAM or the commands input by a keyboard. The CPU is capable of writing data to and or reading data from the external storage unit.

In this case, the computer program may be supplied by being stored in a memory medium such as a flexible disc, CD-ROM and memory card. Further, it may be supplied by transmission through a transmission medium such as the internet. In the case of supplying the computer program by a memory medium, the configuration may be such that the memory medium is inserted to the external storage unit which is connected to a computer so that the medium reads the stored program and transfers it to the computer.

From the invention thus described, it will be obvious that the embodiments of the invention may be varied in many ways. Such variations are not to be regarded as a departure from the spirit and scope of the invention, and all such modifications as would be obvious to one skilled in the art are intended for inclusion within the scope of the following claims.

What is claimed is:

1. A data processing computer implemented method implemented on a programmed computer comprising:
    inputting to the computer a plurality of collection data items that are characteristics of a tangible product, said data items having N (N is an integer of 2 or larger) kinds of variates and stored in a collection database;
    creating a sampling database in a storage medium by randomly sampling from the plurality of collection data items;
    generating with a CPU an N-dimensional response surface model of a design target for the tangible product, and approximating a correlation of the N kinds of variates as a response surface model with reference to the sampling database;
    calculating with the CPU a bootstrap optimum solution of the response surface model as a sampling optimum solution;
    creating a sampling optimum solution database storing a plurality of sampling optimum solutions by repeating the calculating step a predetermined number of times; and
    obtaining a first estimation index with reference to the sampling optimum solution database, said first estimation index including a variance of the sampling optimum solutions to determine a reliability of the optimum solution, wherein
    the generating step includes calculating the optimum solution uniquely by using the response surface model.

2. The data processing method according to claim 1, wherein the first estimation index included a mean of the sampling optimum solution.

3. The data processing method according to claim 1, comprising:
    generating an N-dimensional original curve or surface model approximating a correlation of the N kinds of variates with reference to the collection database;
    calculating an optimum solution of the original curve or surface model; and
    estimating a reliability of the optimum solution of the original curve or surface model based on a comparison result between the optimum solution of the original curve or surface model and the first estimation index.

4. The data processing method according to claim 3, further comprising:
    collecting a new collection data item based on a result of estimating the reliability of the optimum solution of the original curve or surface model.

5. The data processing method according to claim 4, wherein the new collection data item is collected if a difference between the optimum solution of the original curve or surface model and the first estimation index is equal to or larger than a prescribed threshold.

6. The data processing method according to claim 4, wherein
    a mean of the sampling optimum solution is obtained as the first estimation index, and
    data in near proximity to the sampling optimum solution is collected as the new collection data item.

7. The data processing method according to claim 1, wherein the sampling curve or surface model is generated by spline interpolation.

8. The data processing method according to claim 1, wherein
    creating a variate estimation collection database storing variate estimation collection data items excluding an estimation variate which is one or more variate selected from the N kinds of variates of the collection data items stored in the collection database;
    creating a variate estimation sampling database by randomly sampling from the variate estimation collection data items with reference to the variate estimation collection database;
    generating an N-dimensional variate estimation curve or surface model approximating a correlation of the N kinds of variates with reference to the variate estimation sampling database;
    calculating an optimum solution of the variate estimation curve or surface model as a variate estimation optimum solution;
    creating a variate estimation optimum solution database storing a plurality of variate estimation optimum solutions by repeating the creation of the variate estimation sampling database to the calculation of the variate estimation optimum solution;
    obtaining a second estimation index with reference to the variate estimation optimum solution database; and
    estimating the estimation variable based on a comparison result between the first estimation index and the second estimation index.

9. A computer program product, in a computer readable medium, including instructions that when executed by a computer cause the computer to implement a method comprising:
    inputting to the computer a plurality of collection data items that are characteristics of a tangible product, said data items having N (N is an integer of 2 or larger) kinds of variates and stored in a collection database,
    creating a sampling database in a storage medium by randomly sampling from a plurality of collection data items;
    generating with the CPU an N-dimensional response surface model approximating a correlation of the N kinds of variates as a response surface model with reference to the sampling database;
    calculating with the CPU a bootstrap optimum solution of the response surface model as a sampling optimum solution;
    creating a sampling optimum solution database storing a plurality of sampling optimum solutions by repeating the calculating step a predetermined number of times; and
    obtaining a first estimation index with reference to the sampling optimum solution database, said first estimation index including a variance of the sampling optimum solutions, wherein
    the generating step includes calculating the optimum solution uniquely by using the response surface model.

* * * * *